(12) United States Patent
Lim et al.

(10) Patent No.: US 10,256,414 B2
(45) Date of Patent: *Apr. 9, 2019

(54) ORGANIC PHOTOELECTRONIC DEVICE AND IMAGE SENSOR

(71) Applicant: Samsung Electronics Co., Ltd., Suwon-Si, Gyeonggi-Do (KR)

(72) Inventors: Seon-Jeong Lim, Yongin-si (KR); Kyung Bae Park, Hwaseong-si (KR); Dong-Seok Leem, Hwaseong-si (KR); Moon Gyu Han, Yongin-si (KR); Kyu Sik Kim, Yongin-si (KR); Takkyun Ro, Hwaseong-si (KR); Kwang Hee Lee, Yongin-si (KR); Yong Wan Jin, Seoul (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 566 days.

This patent is subject to a terminal disclaimer.

(21) Appl. No.: 14/521,840

(22) Filed: Oct. 23, 2014

(65) Prior Publication Data

US 2015/0162548 A1    Jun. 11, 2015

(30) Foreign Application Priority Data

Dec. 6, 2013    (KR) .................. 10-2013-0151095

(51) Int. Cl.
| | | |
|---|---|---|
| H01L 27/30 | (2006.01) | |
| H01L 51/00 | (2006.01) | |
| H01L 51/42 | (2006.01) | |

(52) U.S. Cl.
CPC ........ *H01L 51/0072* (2013.01); *H01L 27/307* (2013.01); *H01L 51/001* (2013.01); *H01L 51/008* (2013.01); *H01L 51/4253* (2013.01); *H01L 2251/308* (2013.01)

(58) Field of Classification Search
CPC .................. H01L 51/0072; H01L 51/008
See application file for complete search history.

(56) References Cited

U.S. PATENT DOCUMENTS

| | | | | |
|---|---|---|---|---|
| 3,474,020 | A * | 10/1969 | Labana ..................... G01T 1/26 | |
| | | | | 430/32 |
| 3,971,065 | A * | 7/1976 | Bayer ............... H01L 27/14621 | |
| | | | | 313/371 |
| 6,368,395 | B1 | 4/2002 | Nohr et al. | |
| 6,566,807 | B1 * | 5/2003 | Fujita .................. H01L 51/5012 | |
| | | | | 313/504 |
| 9,520,571 | B2 * | 12/2016 | Lee ........................ H01L 51/008 | |
| 2003/0087125 | A1 | 5/2003 | Aziz et al. | |
| 2004/0256554 | A1 | 12/2004 | Hiramoto et al. | |
| 2007/0272918 | A1 | 11/2007 | Rand et al. | |
| 2008/0030802 | A1 | 2/2008 | Tsou et al. | |
| 2009/0026379 | A1 | 1/2009 | Yaegashi et al. | |
| 2009/0050881 | A1 | 2/2009 | Hayashi | |
| 2009/0107539 | A1 * | 4/2009 | Musha ................... B82Y 10/00 | |
| | | | | 136/244 |
| 2009/0223566 | A1 | 9/2009 | Mitsui et al. | |
| 2010/0036134 | A1 | 2/2010 | Mori et al. | |
| 2011/0253992 | A1 | 10/2011 | Rand et al. | |
| 2011/0297234 | A1 | 12/2011 | Forrest et al. | |
| 2012/0090685 | A1 | 4/2012 | Forrest et al. | |
| 2013/0048958 | A1 | 2/2013 | Lim et al. | |
| 2013/0112947 | A1 | 5/2013 | Lee et al. | |
| 2014/0097416 | A1 | 4/2014 | Lee et al. | |

FOREIGN PATENT DOCUMENTS

| | | |
|---|---|---|
| JP | H11-024255 A | 1/1999 |
| JP | 2006-124593 A | 5/2006 |
| JP | 2007-063437 A | 3/2007 |
| JP | 2007234651 A | 9/2007 |
| JP | 2008-206016 A | 9/2008 |
| JP | 2011-032443 A | 2/2011 |
| JP | 2011-140639 A | 7/2011 |
| JP | 2013012535 A | 1/2013 |
| KR | 2013-0022894 A | 3/2013 |
| KR | 2013-0050082 A | 5/2013 |

OTHER PUBLICATIONS

Beaumont et al. "Boron Subphthalocyanine Chloride as an Electron Acceptor for High-Voltage Fullerene-Free Organic Photovoltaics" Advanced Functional Materials, 2012, vol. 22, No. 3, pp. 561-566.*
Seo H. et al, "Color Sensor with Three Vertically Stacked Organic Photodetector"; The Japan Society of Applied Physics; Japanese Journal of Applied PHysics, vol. 46, No. 49, 2007, pp. L1240-L1242; 2007.
Aihara, S. et al. "Stacked Image Sensor with Green- and Red-Sensitive Organic Photoconductive Films Applying Zinc Oxide Thin-Film Transistors to a Signal Readout Circuit"; Institute of Electrical and Electronics engineers; Transactions on Electron Devices, vol. 56, No. 11, p. 2570-2576; Nov. 2009.
Ihama, M. et al. "CMOS Image Sensor with a Thin Overlaid Panchromatic Organic Photoductive Layer for Sensors with Reduced Pixel Size"; FUJIFILM Corporation; International Display Workshops, p. 2123-2126; 2009.

(Continued)

*Primary Examiner* — Joseph R Kosack
(74) *Attorney, Agent, or Firm* — Harness, Dickey & Pierce, P.L.C.

(57) ABSTRACT

Disclosed are an organic photoelectronic device including a first electrode and a second electrode facing each other and an active layer interposed between the first electrode and the second electrode, wherein the active layer includes a p-type semiconductor compound represented by the formula $C_{22}R_1-R_{12}O_2N_2$ and an n-type semiconductor compound having a maximum absorption peak at a wavelength region of about 500 nm to about 600 nm, and an image sensor including the organic photoelectronic device.

17 Claims, 13 Drawing Sheets

(56) References Cited

OTHER PUBLICATIONS

Baierl, D. et al. "A hybrid CMOS-imager with a solutionprocessable polymer as photoactive layer"; Macmillan Macmillan Publishers Limited; Nature Communications, vol. 3, article 1175, p. 1-8; 2012.
Lee, K. et al. "A high performance green-sensitive organic photodiode comprising a bulk heterojunction of dimethylquinacridone and dicyanovinyl terthiophene"; Royal Society of Chemistry Publishing; Journal of materials Chemisty c, vol. 1, p. 2666-2671; 2013.
Korean Search Report dated Jan. 21, 2013.
Morse, "Engineering Boronsubphthalocyanine for Organic Electronic Applications", Doctoral Thesis, Chemical Engineering and Applied Chmesitry, University of Toronto, pp. 1-358 (2012).

* cited by examiner

ORGANIC PHOTOELECTRONIC DEVICE AND IMAGE SENSOR

This application claims priority from Korean Patent Application No. 10-2013-0151095, filed in the Korean Intellectual Property Office on Dec. 6, 2013, the entire contents of which are incorporated herein by reference.

BACKGROUND

1. Field

Example embodiments of an organic photoelectronic device and of an image sensor including the same are disclosed.

2. Description of the Related Art

A photoelectronic device converts light into an electrical signal using photoelectronic effects, and may include a photodiode, a phototransistor, and the like, and may be applied to an image sensor, a solar cell, and the like.

An image sensor including a photodiode typically requires high resolution and thus a small pixel size. Currently, a silicon photodiode is widely used, but presents the disadvantage of deteriorated sensitivity because of a small absorption area due to small pixels. Accordingly, an organic material that is capable of replacing silicon has been researched.

The organic material has a high extinction coefficient and selectively absorbs light in a particular wavelength region depending on a molecular structure, and thus may simultaneously replace a photodiode and a color filter and, as a result, improve sensitivity and contribute to high integration.

SUMMARY

One example embodiment provides an organic photoelectronic device that selectively absorbs light in a green wavelength region and improves efficiency and thermal stability.

Another example embodiment provides an image sensor including the organic photoelectronic device.

According to at least one example embodiment, an organic photoelectronic device includes a first electrode and a second electrode facing each other and an active layer interposed between the first electrode and the second electrode, wherein the active layer includes a p-type semiconductor compound represented by the following Chemical Formula 1 and an n-type semiconductor compound having a maximum absorption peak in a wavelength region of about 500 nm to about 600 nm.

[Chemical Formula 1]

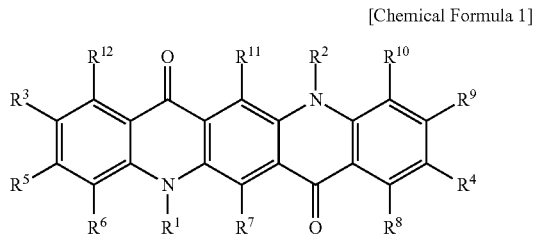

In the above Chemical Formula 1, $R^1$ and $R^2$ may independently be hydrogen, a substituted or unsubstituted C1 to C30 alkyl group, a substituted or unsubstituted C6 to C30 aryl group, or a substituted or unsubstituted C3 to C30 heteroaryl group having electron donating characteristics, or a combination thereof, $R^3$ and $R^4$ may independently be a substituted or unsubstituted C1 to C30 alkyl group, a substituted or unsubstituted C6 to C30 aryl group, or a substituted or unsubstituted C3 to C30 heteroaryl group having electron donating characteristics, or a combination thereof, and $R^5$ to $R^{12}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C30 alkoxy group, a halogen atom, a halogen-containing group, or a combination thereof.

$R^3$ and $R^4$ of the above Chemical Formula 1 may independently be a linear C1 to C10 alkyl group.

$R^1$ and $R^2$ of the above Chemical Formula 1 may independently be a linear C1 to C10 alkyl group.

The compound represented by the above Chemical Formula 1 may be a compound represented by the following Chemical Formula 1a.

[Chemical Formula 1a]

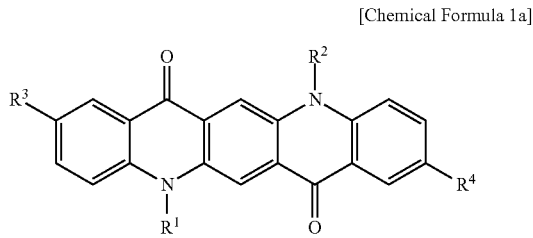

In the above Chemical Formula 1a, $R^1$ to $R^4$ may independently be a substituted or unsubstituted C1 to C30 alkyl group, a substituted or unsubstituted C6 to C30 aryl group, or a substituted or unsubstituted C3 to C30 heteroaryl group having electron donating characteristics, or a combination thereof.

$R^1$ to $R^4$ of the above Chemical Formula 1a may independently be a linear C1 to C10 alkyl group.

The compound represented by the above Chemical Formula 1a may be represented by the following Chemical Formula 1aa or 1ab.

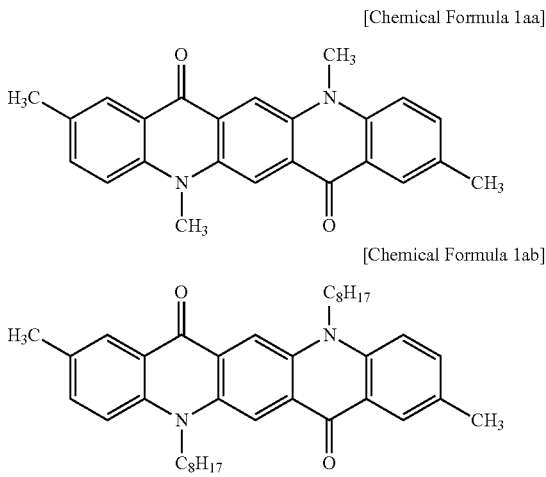

The p-type semiconductor compound may have a thermal decomposition temperature of greater than or equal to about 300° C.

The p-type semiconductor compound may have an extinction coefficient of greater than or equal to about 30,000 cm$^{-1}$ at a maximum absorption wavelength ($\lambda_{max}$).

The n-type semiconductor compound may include at least one of a compound represented by the following Chemical Formula 2 and a compound represented by the following Chemical Formula 3.

[Chemical Formula 2]

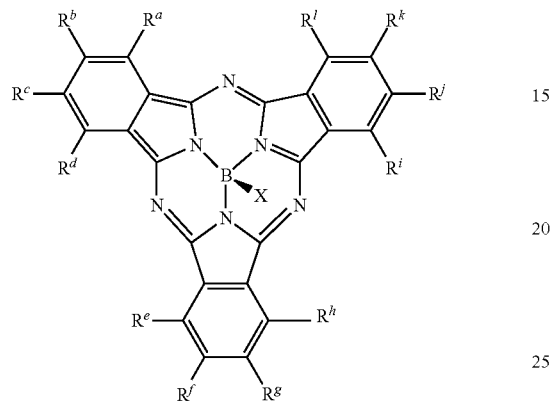

In the above Chemical Formula 2, $R^a$ to $R^l$ may independently be hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and X is an anion.

[Chemical Formula 3]

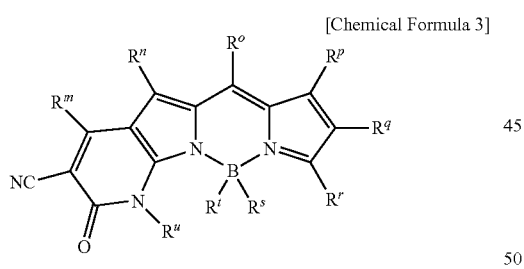

In the above Chemical Formula 3, $R^m$ to $R^u$ are independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof.

At least one of $R^a$ to $R^l$ of the above Chemical Formula 2 may include a halogen atom, and at least one of $R^m$ to $R^u$ of the above Chemical Formula 3 may include a halogen atom.

The compound represented by the above Chemical Formula 2 may include at least one of the compounds represented by the following Chemical Formulae 2a to 2e.

[Chemical Formula 2a]

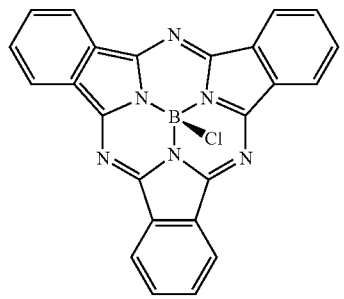

[Chemical Formula 2b]

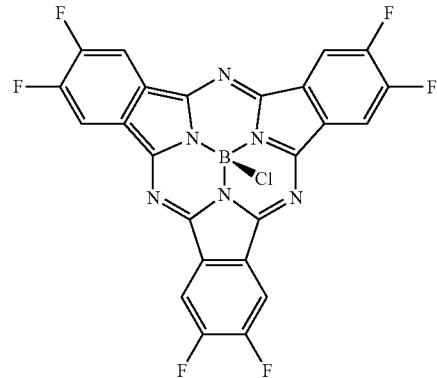

[Chemical Formula 2c]

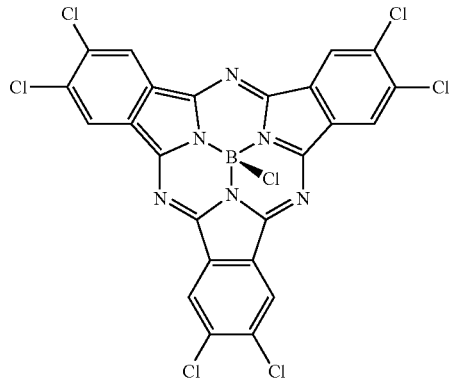

[Chemical Formula 2d]

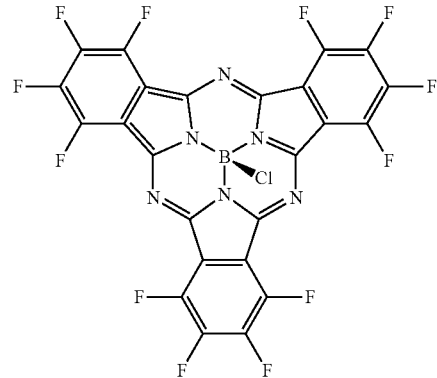

-continued

[Chemical Formula 2e]

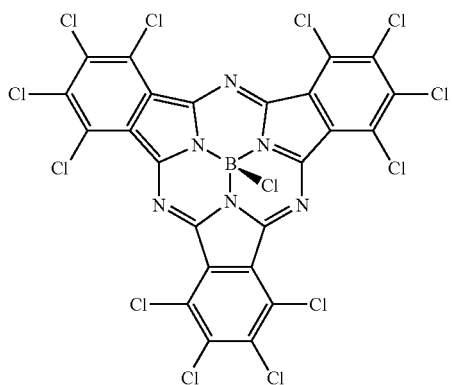

The compound represented by the above Chemical Formula 3 may be represented by the following Chemical Formula 3a.

[Chemical Formula 3a]

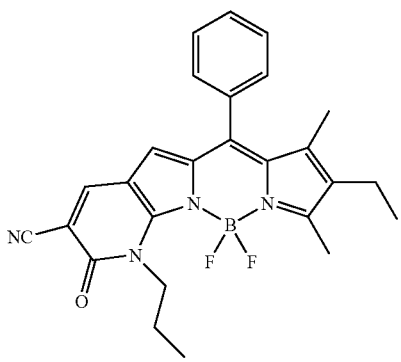

The active layer may include an intrinsic layer including the p-type semiconductor compound and the n-type semiconductor compound in a thickness ratio of about 1:10 to about 10:1.

The active layer may include at least one of a p-type layer including the p-type semiconductor compound and an n-type layer including the n-type semiconductor compound.

The active layer may include a p-type layer including the p-type semiconductor compound and an n-type layer including the n-type semiconductor compound.

The organic photoelectronic device may further include a charge auxiliary layer that is positioned at at least one of between the first electrode and the active layer and between the second electrode and the active layer.

The first electrode and the second electrode may be transparent electrodes.

According to another example embodiment, an image sensor including the organic photoelectronic device is provided.

The organic photoelectronic device may selectively absorb light of a green wavelength region.

The image sensor may include a red pixel, a green pixel, and a blue pixel, the red pixel may include a red filter and a red photo-sensing device, the green pixel may include a green photo-sensing device electrically connected to the organic photoelectronic device, and the blue pixel may include a blue filter and a blue photo-sensing device.

DETAILED DESCRIPTION

Figure 1:
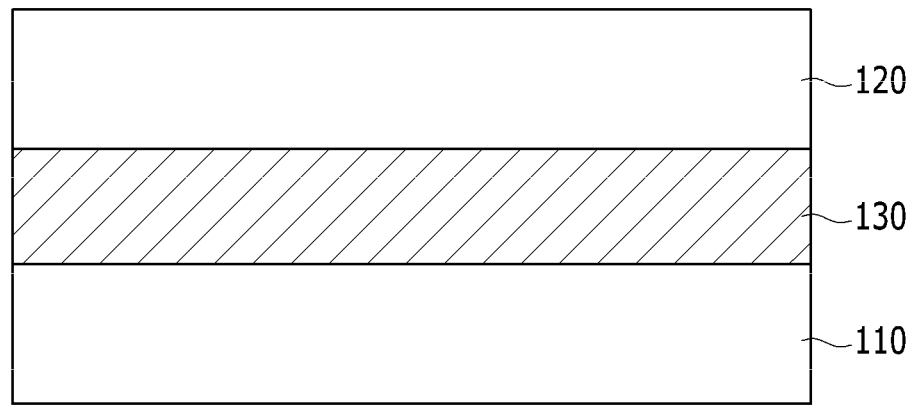
FIG. 1 is a cross-sectional view showing an organic photoelectronic device according to at least one example embodiment.

Example embodiments will hereinafter be described in detail, and may be easily performed by those who have common knowledge in the related art. However, this disclosure may be embodied in many different forms and is not construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

As used herein, when a definition is not otherwise provided, the term "substituted" refers to one substituted with a substituent selected from a halogen atom (F, Br, Cl, or I), a hydroxy group, an alkoxy group, a nitro group, a cyano group, an amino group, an azido group, an amidino group, hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when specific definition is not otherwise provided, the term "hetero" refers to one including 1 to 3 heteroatoms selected from N, O, S, and P.

In the drawings, the thickness of layers, films, panels, regions, etc., are exaggerated for clarity. Like reference numerals designate like elements throughout the specification.

Hereinafter, an organic photoelectronic device according to at least one example embodiment is described referring to FIG. 1.

FIG. 1 is a cross-sectional view showing an organic photoelectronic device according to at least one example embodiment.

Referring to FIG. 1, an organic photoelectronic device 100 according to at least one example embodiment includes a first electrode 110 and a second electrode 120 facing each other, and an active layer 130 interposed between the first electrode 110 and the second electrode 120. For example, one of the first electrode 110 and the second electrode 120 is an anode and the other is a cathode.

According to at least one example embodiment, one of the first electrode 110 and the second electrode 120 is a transparent electrode and the other is an opaque electrode. The transparent electrode may include or be made of, for example, a transparent conductor such as indium tin oxide (ITO) and indium zinc oxide (IZO), and the opaque electrode may include or be made of, for example, an opaque conductor such as aluminum (Al).

According to at least one example embodiment, both of the first electrode 110 and the second electrode 120 may be a transparent electrode, and may include or be made of, for example, a transparent conductor such as indium tin oxide (ITO) and indium zinc oxide (IZO).

The active layer 130 may include a p-type semiconductor material and an n-type semiconductor material to form a pn junction, and externally receives light, produces excitons, and then separates the excitons into holes and electrons.

The p-type semiconductor compound and the n-type semiconductor compound may absorb light in a green wavelength region, and may have a maximum absorption peak in a wavelength region of about 500 nm to 600 nm.

The p-type semiconductor compound may be represented by the following Chemical Formula 1.

[Chemical Formula 1]

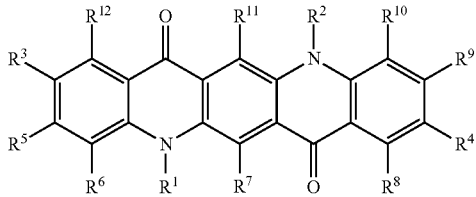

In the above Chemical Formula 1, $R^1$ and $R^2$ may independently be hydrogen, a substituted or unsubstituted C1 to C30 alkyl group, a substituted or unsubstituted C6 to C30 aryl group, or a substituted or unsubstituted C3 to C30 heteroaryl group having electron donating characteristics, or a combination thereof, $R^3$ and $R^4$ may independently be a substituted or unsubstituted C1 to C30 alkyl group, a substituted or unsubstituted C6 to C30 aryl group, or a substituted or unsubstituted C3 to C30 heteroaryl group having electron donating characteristics, or a combination thereof, and $R^5$ to $R^{12}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C30 alkoxy group, a halogen atom, a halogen-containing group, or a combination thereof.

Herein, electron donating characteristics refers to donating an electron when receiving light and forming a hole, and to make a hole in an active layer transport to an anode easily by conductive characteristics according to a HOMO (Highest Occupied Molecular Orbital) level. For example, the heteroaryl group having electron donating characteristics may be a substituted or unsubstituted thiophenyl group, a substituted or unsubstituted furanyl group, a substituted or unsubstituted carbazole group, a substituted or unsubstituted benzofuranyl group, a substituted or unsubstituted benzothiophenyl group, a substituted or unsubstituted dibenzofuranyl group, or a substituted or unsubstituted dibenzothiophenyl group, but is not limited thereto.

The compound represented by the above Chemical Formula 1 includes substituents of $R^3$ and $R^4$, and for example, the $R^3$ substituent and the $R^4$ substituent may be the same. $R^3$ and $R^4$ of the above Chemical Formula 1 may independently be, for example, a linear C1 to C10 alkyl group.

The compound represented by the above Chemical Formula 1 may include an $R^1$ substituent and an $R^2$ substituent as well as the $R^3$ substituent and the $R^4$ substituent, and for example, the $R^1$ substituent and the $R^2$ substituent may be the same. For example, $R^1$ and $R^2$ of the above Chemical Formula 1 may independently be, for example, a linear C1 to C10 alkyl group.

The compound represented by the above Chemical Formula 1 may be, for example, a compound represented by the following Chemical Formula 1a.

[Chemical Formula 1a]

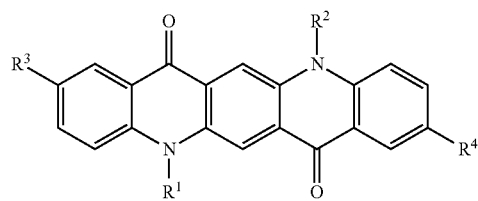

In the above Chemical Formula 1a, $R^1$ to $R^4$ are independently a substituted or unsubstituted C1 to C30 alkyl group, a substituted or unsubstituted C6 to C30 aryl group, or a substituted or unsubstituted C3 to C30 heteroaryl group having electron donating characteristics, or a combination thereof.

In the above Chemical Formula 1a, $R^1$ to $R^4$ may independently be, for example, a linear C1 to C10 alkyl group.

According to at least one example embodiment, the p-type semiconductor compound may have a high thermal decomposition temperature and as a result may increase thermal stability and prevent damage due to heat during a process and/or an operation. The p-type semiconductor compound may have, for example, a thermal decomposition temperature (Td) of greater than or equal to about 300° C., and specifically, about 300° C. to about 500° C. Herein, the thermal decomposition temperature indicates a temperature at which the compound starts to be decomposed and thus does not maintain its original molecular structure but is transformed. In general, since an element including a compound is volatilized into air or vacuum at greater than or equal to a thermal decomposition temperature (Td), the thermal decomposition temperature (Td) may be evaluated as a temperature at which the compound starts to lose its initial weight due to heat, and is measured, for example, via a thermal gravimetric analysis (TGA) method.

According to at least one example embodiment, the p-type semiconductor compound may have a high extinction coefficient in a green wavelength region. For example, when the p-type semiconductor compound is deposited as a thin film, the thin film may have an extinction coefficient of greater than or equal to about 30,000 $cm^{-1}$, and specifically, about 30,000 $cm^{-1}$ to about 100,000 $cm^{-1}$ at a maximum absorption wavelength (λmax). The maximum absorption wavelength (λmax) is a wavelength at which absorbance is the highest and is positioned between about 500 nm and about 600 nm.

The p-type semiconductor compound may have a bandgap of about 1.5 eV to about 3.5 eV and for example, about 2.0 eV to about 2.5 eV within the range. The p-type semiconductor compound has a bandgap within the range and may absorb light in a green wavelength region, and specifically, shows a maximum absorption peak in a wavelength region of about 500 nm to about 600 nm.

The p-type semiconductor compound may have a full width at half maximum (FWHM) of about 50 nm to about 150 nm in an absorbance curve. Herein, the full width at half maximum indicates width of a wavelength corresponding to a half of the maximum absorbance point, and thus a small full width at half maximum indicates selective absorption of light in a narrow wavelength region and high wavelength selectivity. The compound may have a full width at half maximum within the range, and thus may have high selectivity for a green wavelength region.

The n-type semiconductor compound may be any compound that selectively absorbs light in a green wavelength region without limitation.

The n-type semiconductor compound may be, for example, a compound represented by the following Chemical Formula 2.

[Chemical Formula 2]

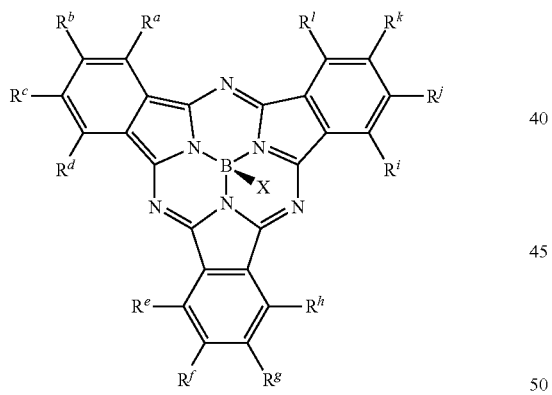

In the above Chemical Formula 2, $R^a$ to $R^l$ are independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and X is an anion.

For example, at least one of $R^a$ to $R^l$ of the above Chemical Formula 2 may include a halogen atom.

The compound represented by the above Chemical Formula 2 may include at least one of the compounds represented by the following Chemical Formulae 2a to 2e, but is not limited thereto.

[Chemical Formula 2a]

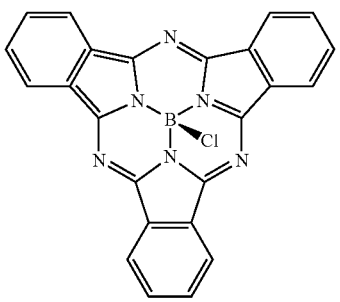

[Chemical Formula 2b]

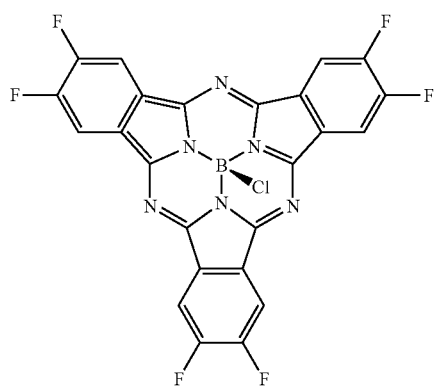

[Chemical Formula 2c]

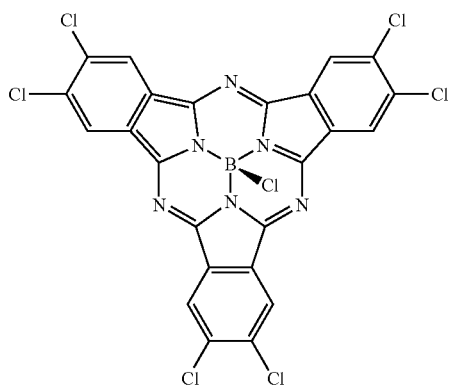

[Chemical Formula 2d]

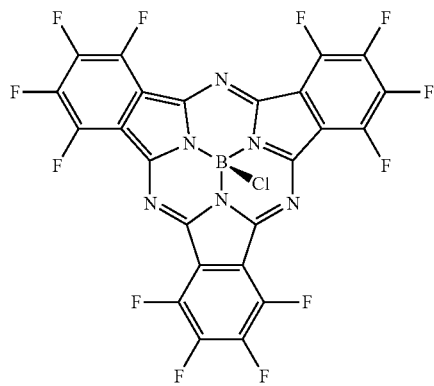

-continued

[Chemical Formula 2e]

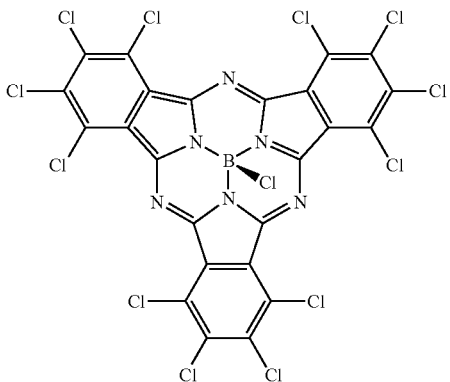

The n-type semiconductor compound may be, for example, a compound represented by the following Chemical Formula 3.

[Chemical Formula 3]

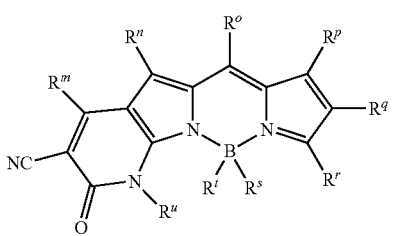

In the above Chemical Formula 3, $R^m$ to $R^u$ are independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof.

For example, at least one of $R^m$ to $R^u$ of the above Chemical Formula 3 may include a halogen atom.

The compound represented by the above Chemical Formula 3 may be represented by the following Chemical Formula 3a, but is not limited thereto.

[Chemical Formula 3a]

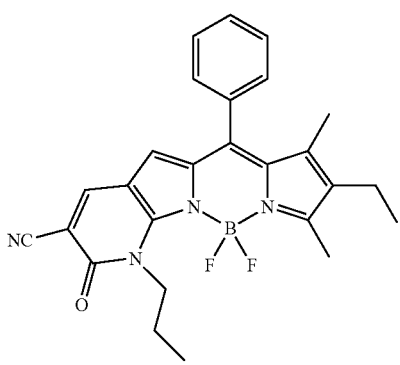

The n-type semiconductor compound may include at least one of the compound represented by the above Chemical Formula 2 and the compound represented by the above Chemical Formula 3, but is not limited thereto.

The n-type semiconductor compound may have a bandgap of, for example, about 1.5 eV to about 3.5 eV, and specifically about 2.0 eV to about 2.5 eV. When the n-type semiconductor compound has a bandgap within the range, light in a green wavelength region may be absorbed, and specifically, may have a maximum absorption peak in a wavelength region of about 500 nm to 600 nm.

The n-type semiconductor compound may have a full width at half maximum (FWHM) of about 50 nm to about 150 nm in an absorbance curve. The compound may have a full width at half maximum within the range, and thus may have high selectivity for a green wavelength region.

The p-type semiconductor compound and the n-type semiconductor compound may have a LUMO (Lowest Unoccupied Molecular Orbital) energy level difference of about 0.2 to about 0.7 eV, and specifically about 0.3 to about 0.5 eV. When the p-type semiconductor compound and the n-type semiconductor compound in the active layer 130 have a LUMO energy level difference within the range, external quantum efficiency (EQE) may be improved and effectively adjusted depending on a bias applied thereto.

According to at least one example embodiment, the active layer 130 may be a single layer or a multilayer. The active layer 130 may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor compound and the n-type semiconductor compound in a thickness ratio of about 1:100 to about 100:1. The compounds may be included in a thickness ratio ranging from about 1:50 to about 50:1 within the range, specifically, about 1:10 to about 10:1, and more specifically, about 1:1. When the p-type and n-type semiconductors have a composition ratio within the range, an exciton may be effectively produced, and a pn junction may be effectively formed.

The p-type layer may include the p-type semiconductor compound, and the n-type layer may include the n-type semiconductor compound.

The active layer 130 may have a thickness of about 1 nm to about 500 nm, and specifically about 5 nm to about 300 nm. When the active layer 130 has a thickness within the range, the active layer may effectively absorb light, effectively separate holes from electrons, and deliver them, effectively improving photoelectric conversion efficiency.

In the organic photoelectronic device 100, when light is incident from the first electrode 110 and/or second electrode 120, and when the active layer 130 absorbs light having a predetermined wavelength region, excitons may be produced from the inside. The excitons are separated into holes and electrons at the active layer 130, and the separated holes are transported to an anode that is one of the first electrode 110 and the second electrode 120, and the separated electrons are transported to the cathode that is the other of the first electrode 110 and the second electrode 120 so as to flow a current in the organic photoelectronic device.

Figure 2:
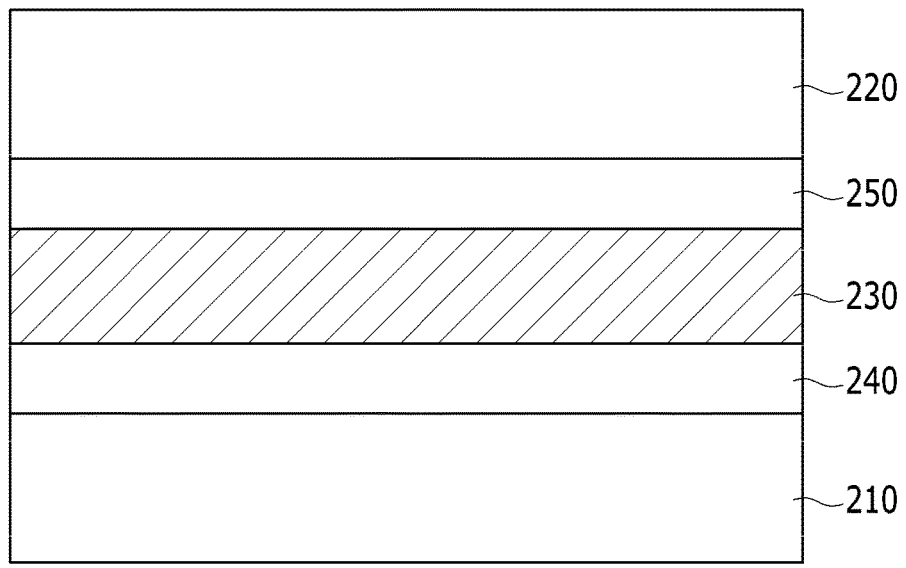
FIG. 2 is a cross-sectional view showing an organic photoelectronic device according to another example embodiment.

Referring to FIG. 2, an organic photoelectronic device according to another example embodiment is described.

FIG. 2 is a cross-sectional view of an organic photoelectronic device according to another example embodiment.

Referring to FIG. 2, an organic photoelectronic device 200 according to at least one example embodiment includes a first electrode 210 and a second electrode 220 facing each other and an active layer 230 interposed between the first electrode 210 and the second electrode 220.

The organic photoelectronic device 200 according to the example embodiment further includes charge auxiliary layers 240 and 250 respectively between the first electrode 210 and the active layer 230 and between the second electrode 220 and the active layer 230. The charge auxiliary layers 240 and 250 may facilitate the transfer of holes and electrons separated from the active layer 230, so as to increase efficiency.

According to at least one example embodiment, the charge auxiliary layers 240 and 250 may be at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 240 and 250 may include, for example an organic material, an inorganic material, or an organic/inorganic material. The organic material may include an organic compound having hole or electron characteristics, and the inorganic material may be, for example, a metal oxide such as molybdenum oxide, tungsten oxide, nickel oxide, and the like.

The hole transport layer (HTL) may include one of, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto. The electron blocking layer (EBL) may include one of, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one of, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one of, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 240 and 250 may be omitted.

The organic photoelectronic device may be applied to various fields, for example a solar cell, an image sensor, a photo-detector, a photo-sensor, and an organic light emitting diode (OLED), but is not limited thereto.

Hereinafter, an example of an image sensor including the organic photoelectronic device is described referring to drawings. As an example of an image sensor, an organic CMOS image sensor is described.

Figure 3:
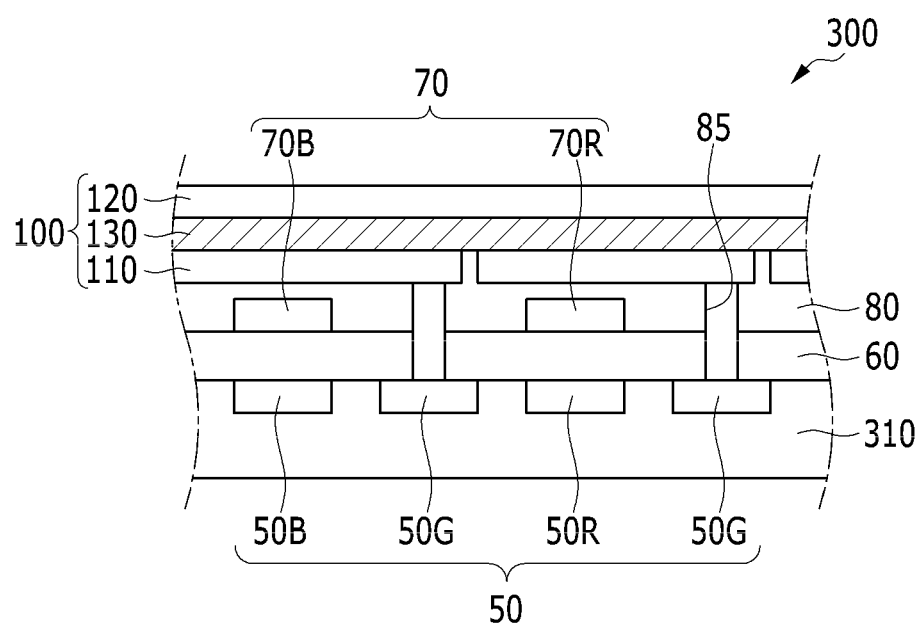
FIG. 3 is a cross-sectional view showing an organic CMOS image sensor according to at least one example embodiment.

FIG. 3 is a cross-sectional view of an organic CMOS image sensor according to at least one example embodiment.

FIG. 3 illustrates blue, green, and red pixels that are adjacent to one another, but is not limited thereto. Hereinafter, a constituent element including "B" in the reference symbol refers to a constituent element included in the blue pixel, a constituent element including "G" in the reference symbol refers to a constituent element included in the green pixel, and a constituent element including "R" in the reference symbol refers to a constituent element included in the red pixel.

Referring to FIG. 3, an example organic CMOS image sensor 300 includes a semiconductor substrate 310 integrated with a photo-sensing device 50 and a transmission transistor (not shown), a lower insulation layer 60, a color filter 70, an upper insulation layer 80, and an organic photoelectronic device 100.

The semiconductor substrate 310 may be a silicon substrate, and may be integrated with the photo-sensing device 50 and the transmission transistor (not shown). The photo-sensing device 50 may be a photodiode. The photo-sensing device 50 and the transmission transistor may be integrated in each pixel, and as shown in the drawing, the example photo-sensing device 50 includes a blue pixel photo-sensing device 50B, a green pixel photo-sensing device 50G, and a red pixel photo-sensing device 50R. The photo-sensing device 50 senses light, and the information sensed by the photo-sensing device 50 is transferred by the transmission transistor.

Metal wires (not shown) and pads (not shown) may be formed on the semiconductor substrate 310. In order to decrease signal delay, the metal wires and pads may be made of a metal having low resistivity, for example, aluminum (Al), copper (Cu), silver (Ag), and alloys thereof, but is not limited thereto. However, the metal wires and pads may be positioned under the photo-sensing device 50 without being limited to the structure.

The lower insulation layer 60 may be formed on the metal wires and pads. The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench (not shown) exposing each photo-sensing device 50B, 50G, and 50R of each pixel. The trench may be filled with fillers.

A color filter 70 is formed on the lower insulation layer 60. The color filter 70 includes the blue filter 70B formed in the blue pixel and the red filter 70R filled in the red pixel. In at least one example embodiment, a green filter is not included, but a green filter may be further included.

According to at least one example embodiment, the upper insulation layer 80 is formed on the color filter 70. The upper insulation layer 80 eliminates a step caused by the color filters 70 and smoothes the surface. The upper insulation layer 80 and lower insulation layer 60 may include a contact hole (not shown) exposing a pad and a penetration hole 85 exposing the photo-sensing device 50G of a green pixel.

According to at least one example embodiment, the organic photoelectronic device 100 is formed on the upper insulation layer 80. The organic photoelectronic device 100 includes the first electrode 110, the active layer 130, and the second electrode 120 as described above. However, the positions of the first electrode 110 and the second electrode 120 may be exchanged with each other.

Both of the first electrode 110 and the second electrode 120 may be transparent electrodes, and the active layer 130 may include the p-type semiconductor compound and n-type semiconductor compound that selectively absorb light in a green wavelength region as described above, and may replace a color filter of green pixels. When light enters from the second electrode 120, the light in a green wavelength region may be mainly absorbed in the active layer 130 and photoelectronically converted, while the light in the rest of the wavelength regions passes through the first electrode 110 and may be sensed in a photo-sensing device 50.

Figure 4:
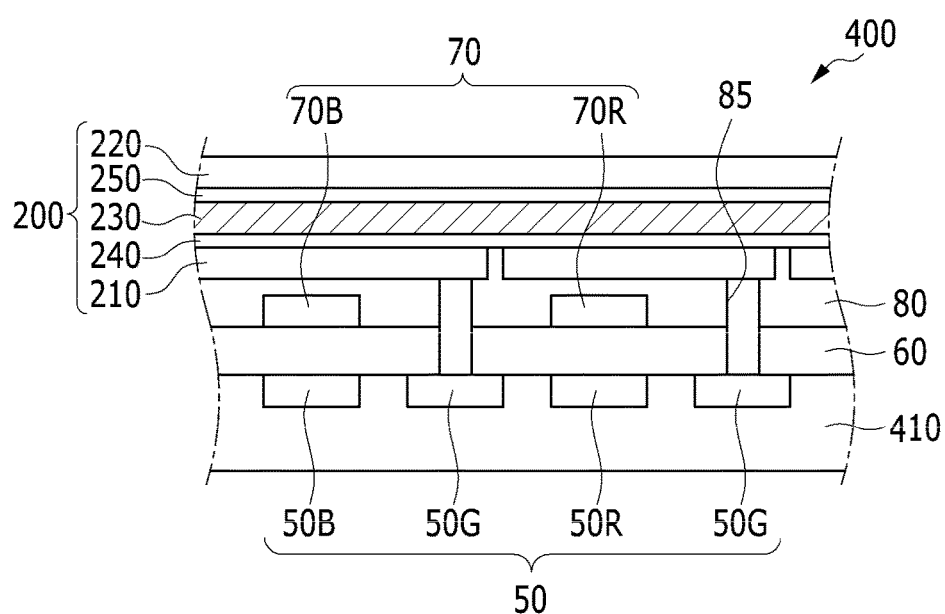
FIG. 4 is a cross-sectional view showing an organic CMOS image sensor according to another example embodiment.

FIG. 4 is cross-sectional view of an organic CMOS image sensor according to at least one example embodiment.

Referring to FIG. 4, an organic CMOS image sensor 400 according to the example embodiment includes a semiconductor substrate 410 integrated with a photo-sensing device 50 and a transmission transistor (not shown), a lower insulation layer 60, color filters 70B and 70R, and an upper insulation layer 80. The organic CMOS image sensor 400 includes the organic photoelectronic device 200 including charge auxiliary layers 240 and 250, instead of the organic photoelectronic device 100 described above. Either one of the charge auxiliary layers 240 and 250 may be omitted.

Hereinafter, example embodiments of the present disclosure are illustrated in more detail with reference to examples. However, the present disclosure is not limited thereto.

SYNTHESIS EXAMPLE

Synthesis Example 1

[Chemical Formula 1aa]

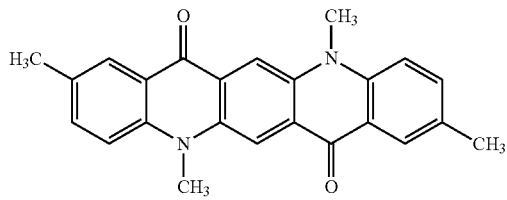

[Reaction Scheme 1]

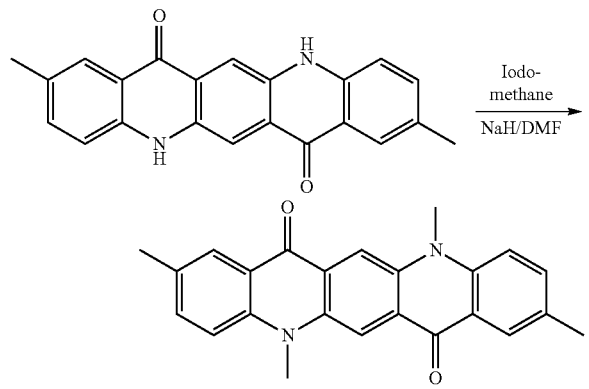

1 mmol of 2,9-dimethylquinacridone (Chemieliva Pharmaceutical Co., Ltd.) is dissolved in 40 ml of dimethyl formamide (DMF). Subsequently 2.5 mmol of NaH (60% oil dispersion) is added to the mixture at 0° C. The obtained mixture is then agitated at 60° C. for 30 minutes and cooled down to room temperature while maintaining agitation. Subsequently, 2.5 mmol of iodomethane is added to the mixture, and the obtained mixture is additionally agitated at 60° C. for 18 hours and supplied with water. The obtained mixture is filtered to collect a solid, and the solid is completely washed, obtaining a reddish orange solid. The solid is filtered through silica gel column chromatography and recrystallized twice by using hexane, obtaining a compound represented by the above Chemical Formula 1aa. The compound has a boiling point of 325° C., and its yield is 74%.

1H-NMR and mass data of the compound is as follows.

1H-NMR (CDCl$_3$, 300 MHz): δ8.75 (s, 2H), δ8.35 (s, 2H), δ7.59 (d, 2H, J=9.0 Hz), δ7.48 (d, 2H, J=9.0 Hz), δ4.05 (s, 6H), δ2.49 (s, 6H).

MALDI-TOF mass: 368.94 (m/z). Elemental analysis: Calculated for $C_{24}H_2ON_2O_2$: C, 78.24%; H, 5.47%; N, 7.60%; O, 8.69%. Found: C, 78.16%; H, 5.46%; N, 7.59%; O, 8.79%.

Synthesis Example 2

[Chemical Formula 1ab]

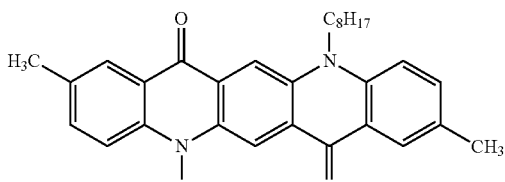

[Reaction Scheme 2]

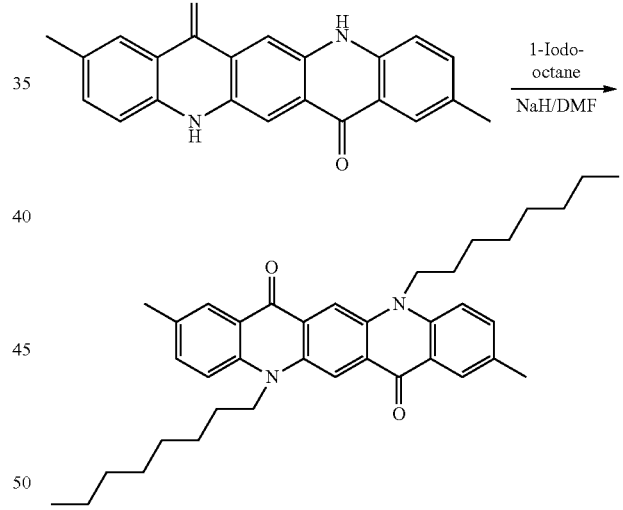

A compound represented by the above Chemical Formula 1ab is synthesized according to the same method as Synthesis Example 1, except for using 2.5 mmol of 1-iodooctane instead of the iodomethane. The compound has a boiling point of 230° C.

1H-NMR and mass data of the compound is as follows.

1H-NMR (CDCl$_3$, 300 MHz): δ8.72 (s, 2H), δ8.33 (s, 2H), δ7.54 (d, 2H, J=9.0 Hz), δ7.42 (d, 2H, J=9.0 Hz), δ4.49 (m, 4H), δ2.48 (s, 6H), δ1.98 (m, 4H), δ1.46 (m, 20H), δ0.90 (m, 6H).

MALDI-TOF mass: 565.02 (m/z).

Elemental analysis: Calculated for $C_{38}H_{48}N_2O_2$: C, 80.81%; H, 8.57%; N, 4.96%; O, 5.67%. Found: C, 80.86%; H, 8.65%; N, 4.95%; O, 5.54%.

Synthesis Example 3

A compound represented by the following Chemical Formula 2a is prepared (sublimed grade, Luminescence Technology Corp.)

[Chemical Formula 2a]

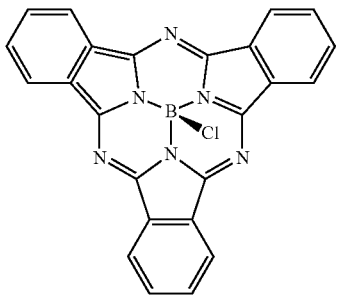

Synthesis Example 4

A compound represented by the following Chemical Formula 3a is prepared as described in Org. Biomol. Chem., 2013, 11, 372-377.

[Chemical Formula 3a]

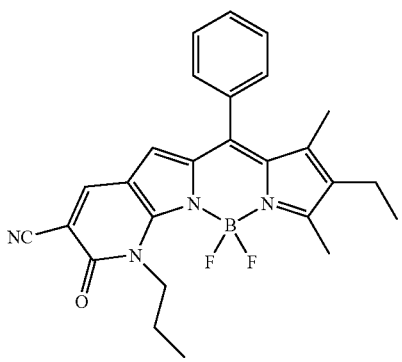

Comparative Synthesis Example 1

A compound represented by the following Chemical Formula A (Tokyo Chemical Industry Co., Ltd.) is prepared.

[Chemical Formula A]

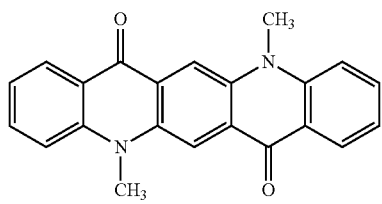

Evaluation I
Evaluation 1: Absorbance Characteristics of p-type Semiconductor Compound Absorbance characteristics of the compounds according to Synthesis Examples 1 and 2 and Comparative Synthesis Example 1 depending on a wavelength are evaluated. The absorbance characteristics are evaluated by thermally evaluating the compounds of Synthesis Examples 1 and 2 and Comparative Synthesis Example 1 under high vacuum ($<10^{-7}$ Torr) at a speed of 0.5-1.0 Å/s to form each thin film having a thickness of 50 nm to 100 nm and radiating ultraviolet (UV)-visible (UV-Vis) rays thereto by using a Cary 5000 UV spectrophotometer (Varian Inc).

Figure 5:
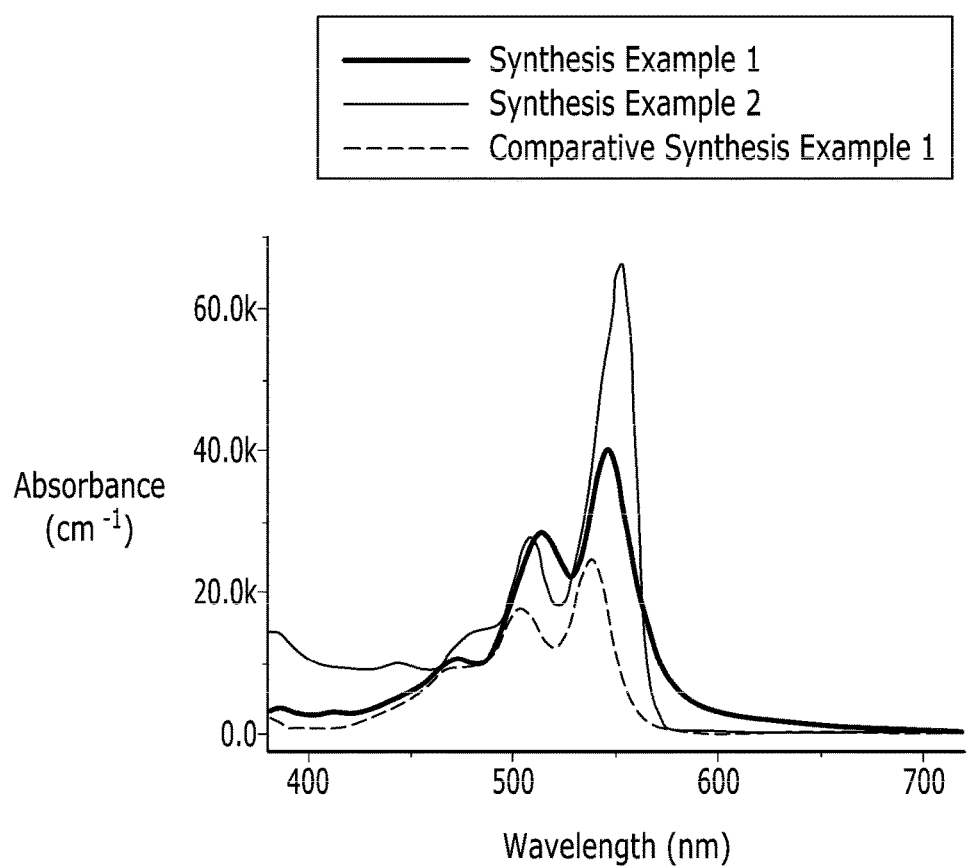
FIG. 5 is a graph showing absorbance characteristics of compounds according to Synthesis Examples 1 to 4 and Comparative Synthesis Example 1 depending on a wavelength.

The results are provided in FIG. 5 and Table 1.

FIG. 5 is a graph showing absorbance characteristics of the compound of Synthesis Examples 1 and 2 and Comparative Synthesis Example 1 depending on a wavelength.

Referring to FIG. 5 and Table 1, the compounds according to Synthesis Examples 1 and 2 show improved absorbance in a green wavelength region ranging from about 500 nm to 600 nm compared with the compound according to Comparative Synthesis Example 1.

TABLE 1

| | Maximum absorption wavelength ($\lambda_{max}$, nm) | Extinction coefficient ($\varepsilon$, cm$^{-1}$) |
|---|---|---|
| Synthesis Example 1 | 546 | 40,000 |
| Synthesis Example 2 | 552 | 67,000 |

Evaluation 2: Thermal Stability of p-type Semiconductor Compound

Thermal stability of the compounds according to Synthesis Examples 1 and 2 and Comparative Synthesis Example 1 is evaluated.

The thermal stability is evaluated by using a thermal decomposition temperature ($T_d$) of the compounds according to Synthesis Examples 1 and 2 and Comparative Synthesis Example 1 in a thermal gravimetric analysis (TGA) method (Q5000IR, TA Instruments, USA). The thermal gravimetric analysis method is performed by increasing the temperature from room temperature to 600° C. at a speed of 10° C./min under a $N_2$ atmosphere.

The results are provided in Table 2.

TABLE 2

| | Thermal decomposition temperature ($T_d$, ° C.) |
|---|---|
| Synthesis Example 1 | 325 |
| Synthesis Example 2 | 350 |
| Comparative Synthesis Example 1 | 250 |

Referring to Table 2, the compounds according to Synthesis Examples 1 and 2 show a much higher thermal decomposition temperature than the compound according to Comparative Synthesis Example 1. Accordingly, the compounds of Synthesis Examples 1 and 2 show improved thermal stability compared with the compound of Comparative Synthesis Example 1.

Evaluation 3: Absorbance Characteristic of n-type Semiconductor Compound

Absorbance characteristics of the compounds according to Synthesis Examples 3 and 4 depending on a wavelength are evaluated.

The absorbance characteristics are evaluated by thermally evaporating the compounds of Synthesis Examples 3 and 4 under a high vacuum ($<10^{-7}$ Torr) at a speed of 0.5-1.0 Å/s to form each thin film having a thickness of 50 nm to 100 nm and radiating ultraviolet (UV)-visible rays (UV-Vis) thereto by using a Cary 5000 UV spectrophotometer (Varian Inc.).

Figure 6:
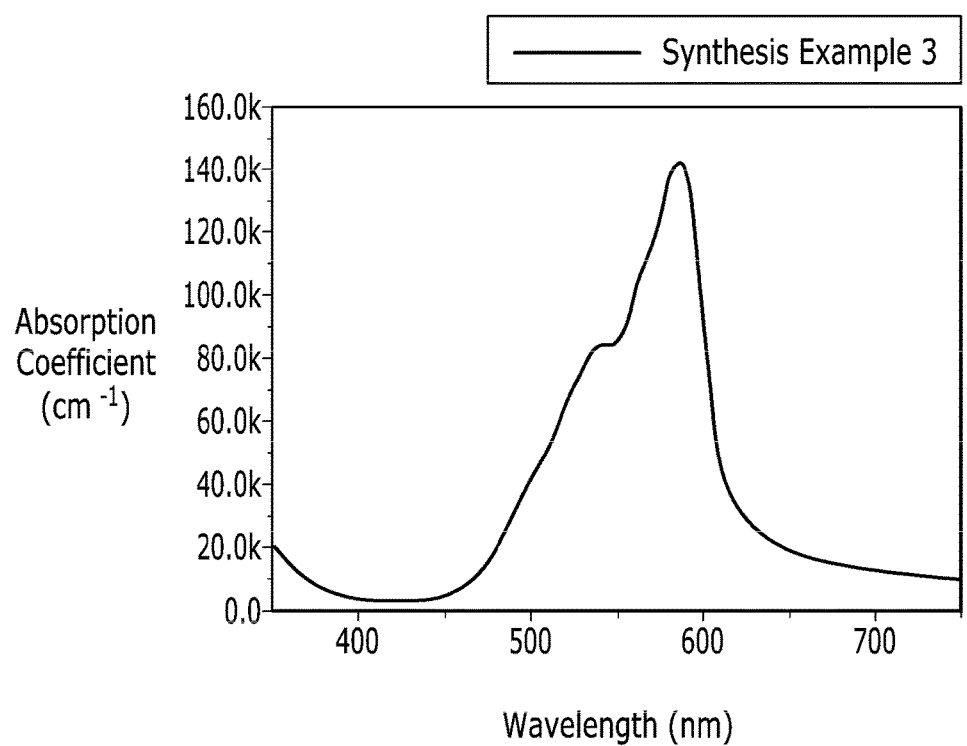
FIG. 6 is a graph showing absorbance characteristics of a compound according to Synthesis Example 3 depending on a wavelength.
Figure 7:
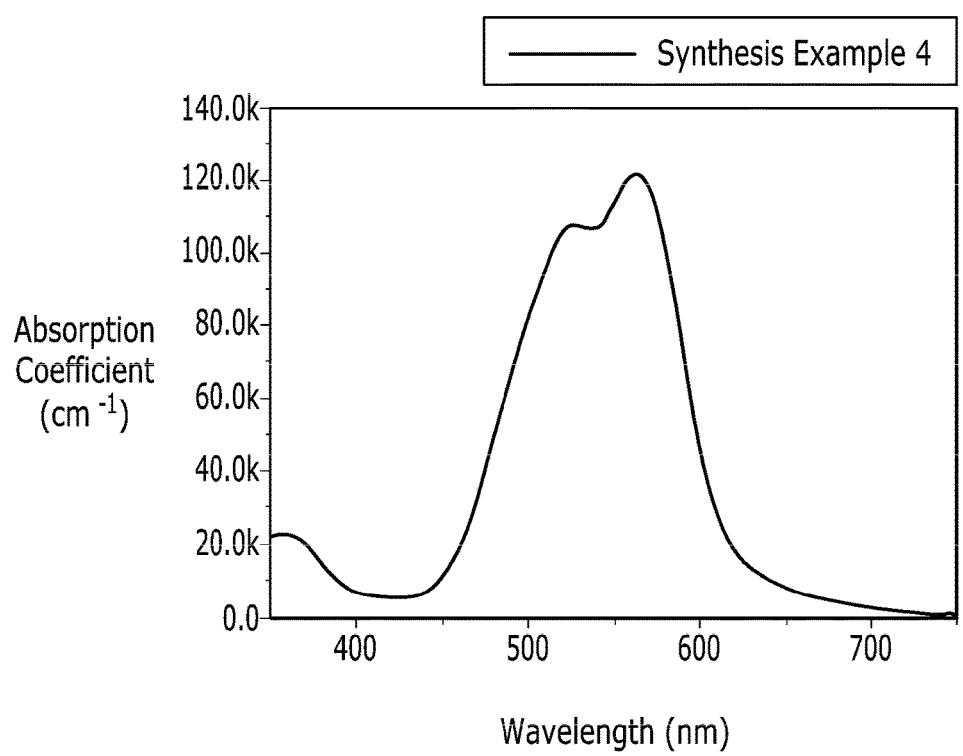
FIG. 7 is a graph showing absorbance characteristics of a compound according to Synthesis Example 4 depending on a wavelength.

FIG. 6 is a graph showing absorbance characteristics of the compound according to Synthesis Example 3 depending on a wavelength, and FIG. 7 is a graph showing absorbance characteristics of the compound according to Synthesis Example 4.

Referring to FIGS. 6 and 7, the compounds of Synthesis Examples 3 and 4 show a maximum absorption peak in a wavelength region of about 500 nm to 600 nm.

Manufacture of Organic Photoelectronic Device

Example 1

An anode about 100 nm-thick is formed by sputtering ITO (Indium Tin Oxide) on a glass substrate, and a 30 nm-thick charge auxiliary layer is formed by depositing a molybdenum oxide ($MoO_x$) thereon. Subsequently, a 70 nm-thick active layer is formed by co-depositing the p-type semiconductor compound according to Synthesis Example 1 and the n-type semiconductor compound according to Synthesis Example 3 in a ratio of 1:1 on the molybdenum oxide ($MoO_x$) thin film. Subsequently, an 80 nm-thick cathode is formed on the active layer by sputtering aluminum (Al), manufacturing an organic photoelectronic device.

Comparative Example 1

An organic photoelectronic device is manufactured according to the same method as Example 1, except for using the compound of Comparative Synthesis Example 1 instead of the compound of Synthesis Example 1 as a p-type semiconductor.

Comparative Example 2

An organic photoelectronic device is manufactured according to the same method as Example 1, except for using the compound of Comparative Synthesis Example 1 instead of the compound of Synthesis Example 1 as a p-type semiconductor and fullerene (C60) instead of the compound of Synthesis Example 3 as an n-type semiconductor compound.

Evaluation II

Evaluation 4: External Quantum Efficiency (EQE)

External quantum efficiency (EQE) of the organic photoelectronic devices according to Example 1 and Comparative Examples 1 and 2 with respect to a wavelength is evaluated.

The external quantum efficiency is evaluated by using an IPCE measurement system (McScience Inc., Korea). First, the organic photoelectronic devices of Example 1 and Comparative Example 1 are mounted in the IPCE measurement system after calibrating the IPCE measurement system by using a Si photodiode (Hamamatsu Photonics K.K., Japan), and then external quantum efficiency of the organic photoelectronic devices is measured in a wavelength range of about 350 nm to 750 nm.

Figure 8:
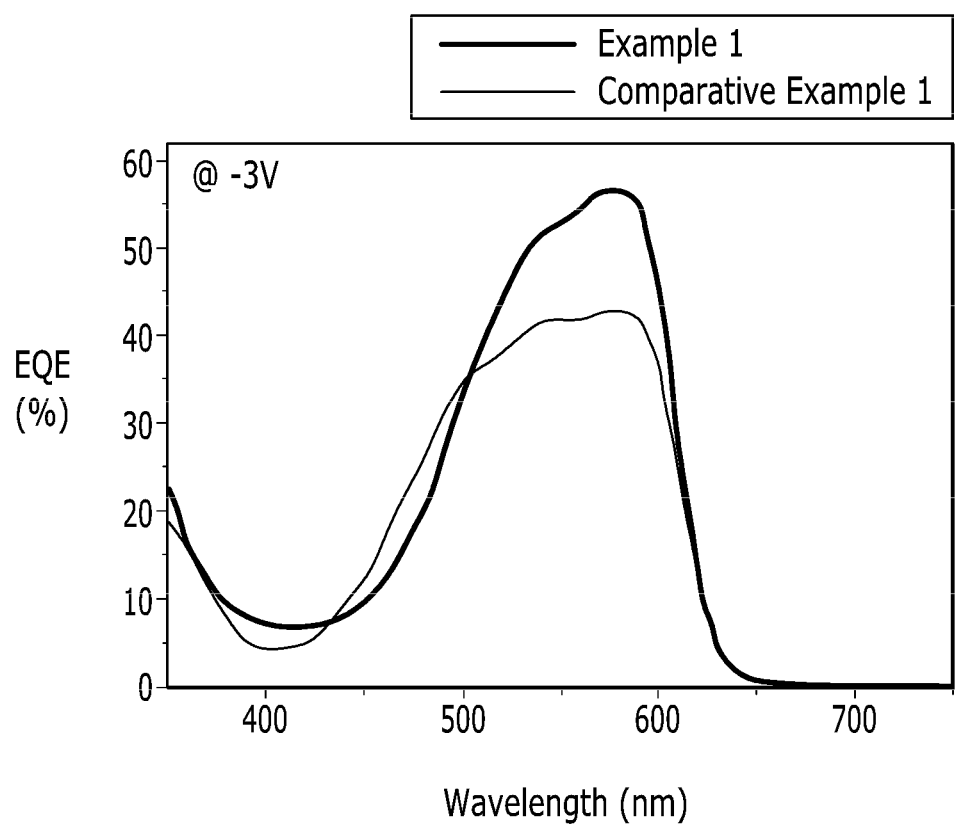
FIG. 8 is a graph showing external quantum efficiency (EQE) of the photoelectronic devices according to Example 1 and Comparative Example 1 depending on wavelengths.
Figure 9:
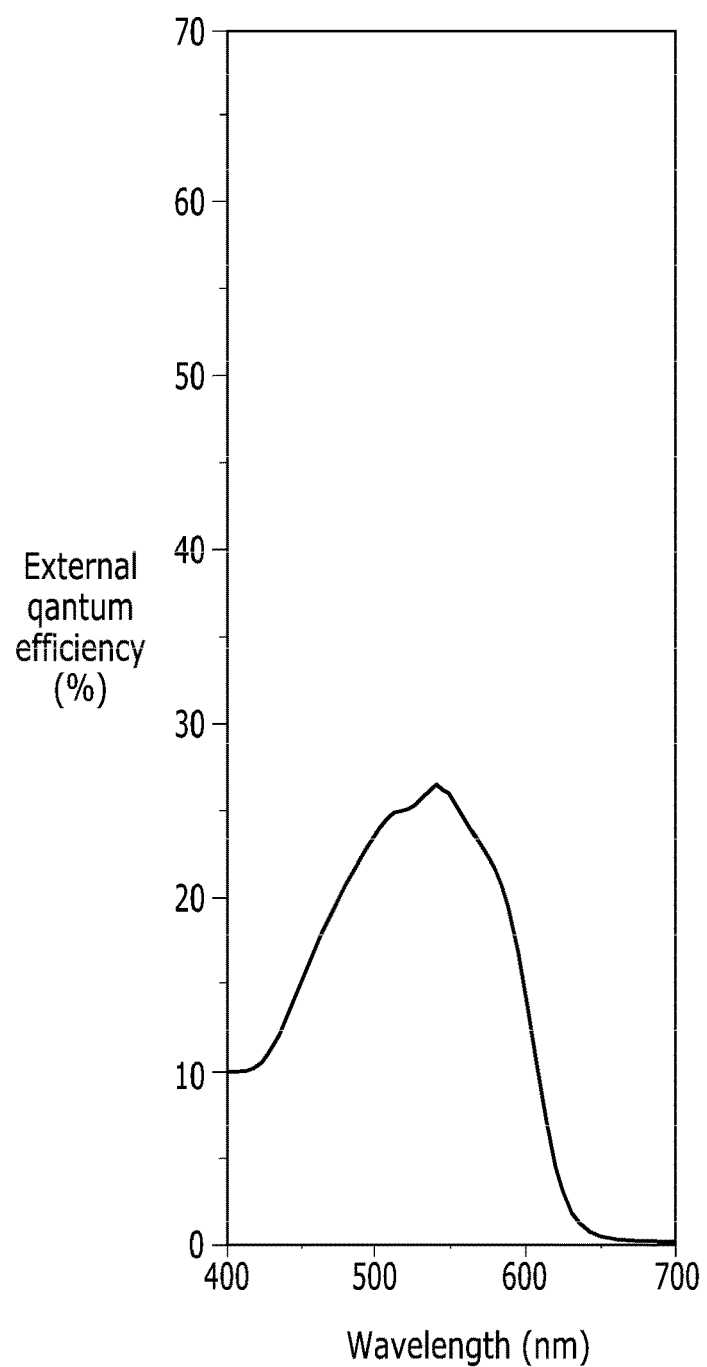
FIG. 9 is a graph showing external quantum efficiency (EQE) of the photoelectronic device according to Comparative Example 2 depending on wavelengths.

FIG. 8 is a graph showing external quantum efficiency (EQE) of the organic photoelectronic devices according to Example 1 and Comparative Example 1 depending on a wavelength, and FIG. 9 is a graph showing external quantum efficiency (EQE) of the organic photoelectronic device according to Comparative Example 2 depending on a wavelength.

Referring to FIGS. 8 and 9, the organic photoelectronic device of Example 1 shows improved external quantum efficiency (EQE) in a wavelength region of about 500 nm to 600 nm compared with the organic photoelectronic devices according to Comparative Examples 1 and 2. Accordingly, the organic photoelectronic device of Example 1 shows improved efficiency compared with the organic photoelectronic devices of Comparative Examples 1 and 2.

Evaluation 5: Thermal Stability

Thermal stability of the organic photoelectronic device according to Example 1 is evaluated.

The thermal stability is evaluated by allowing the organic photoelectronic device of Example 1 to stand at 100° C. for 30 minutes and examining external quantum efficiency (EQE) and current density (current density) changes of the organic photoelectronic device.

Figure 10:
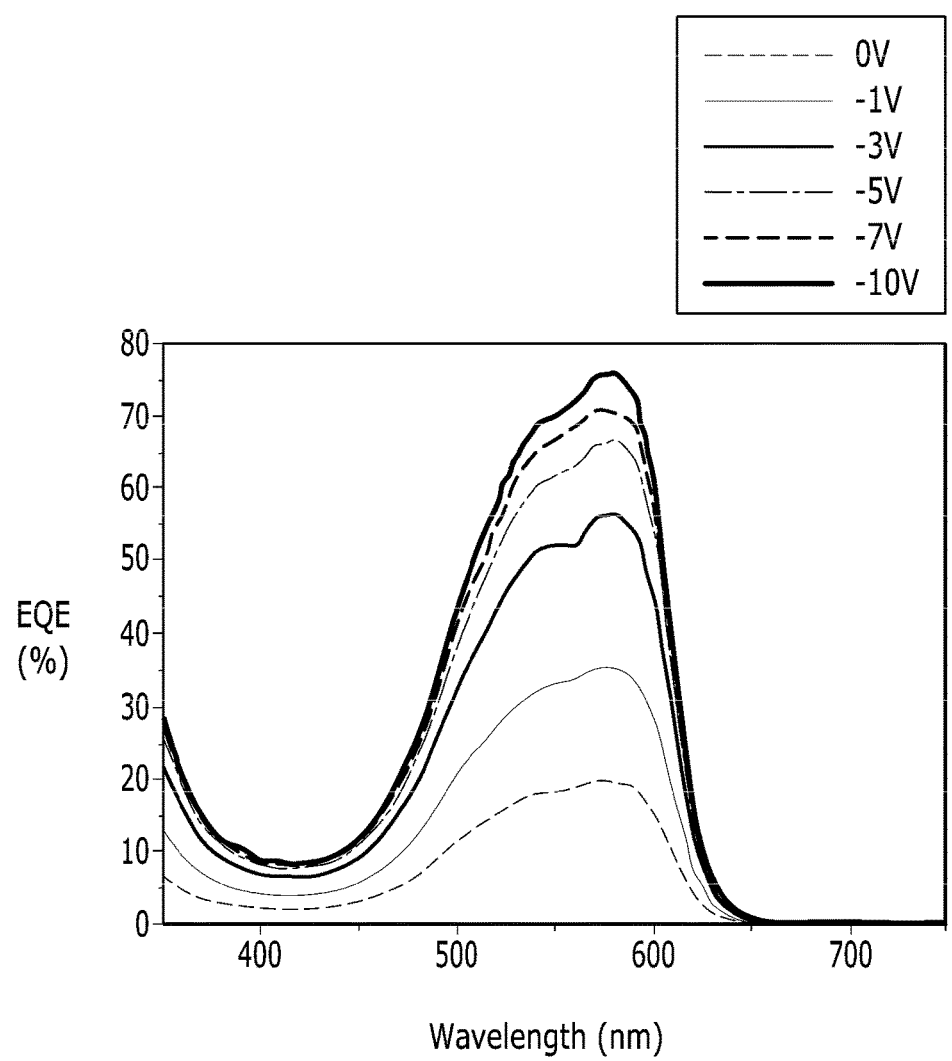
FIG. 10 is a graph showing external quantum efficiency (EQE) of the organic photoelectronic device according to Example 1 depending on a voltage applied thereto and a wavelength.
Figure 11:
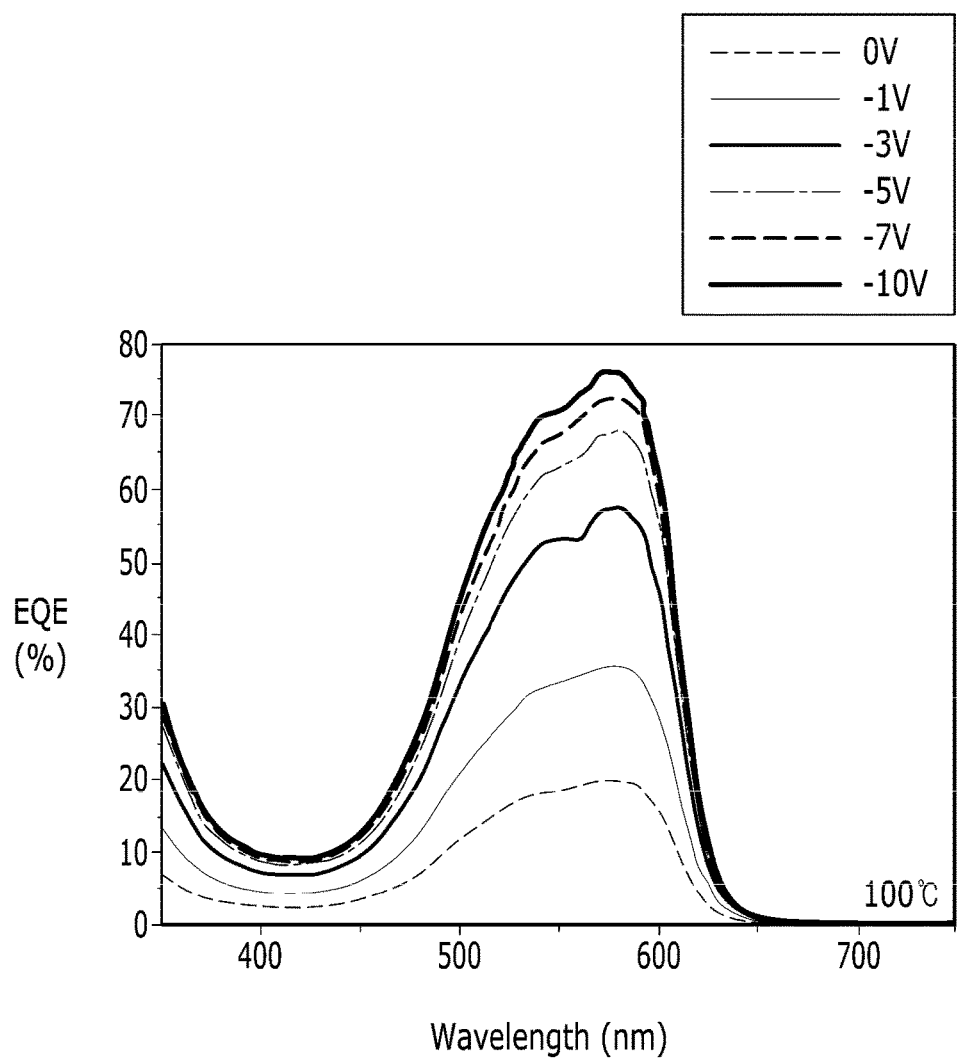
FIG. 11 is a graph showing external quantum efficiency (EQE) of the organic photoelectronic device according to Example 1 depending on a voltage applied thereto and a wavelength after being allowed to stand at 100° C. for 30 minutes.
Figure 12:
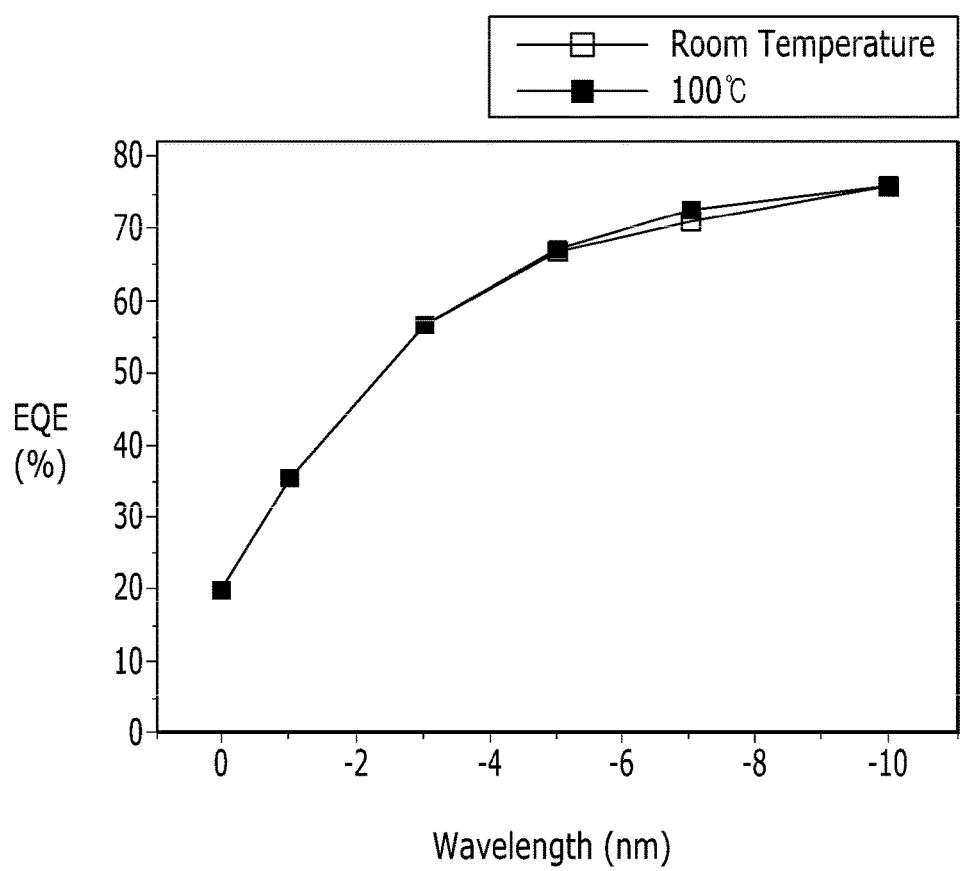
FIG. 12 is a graph showing external quantum efficiency (EQE) change of the organic photoelectronic device according to Example 1 depending on a voltage before and after allowed to stand at 100° C. for 30 minutes.
Figure 13:
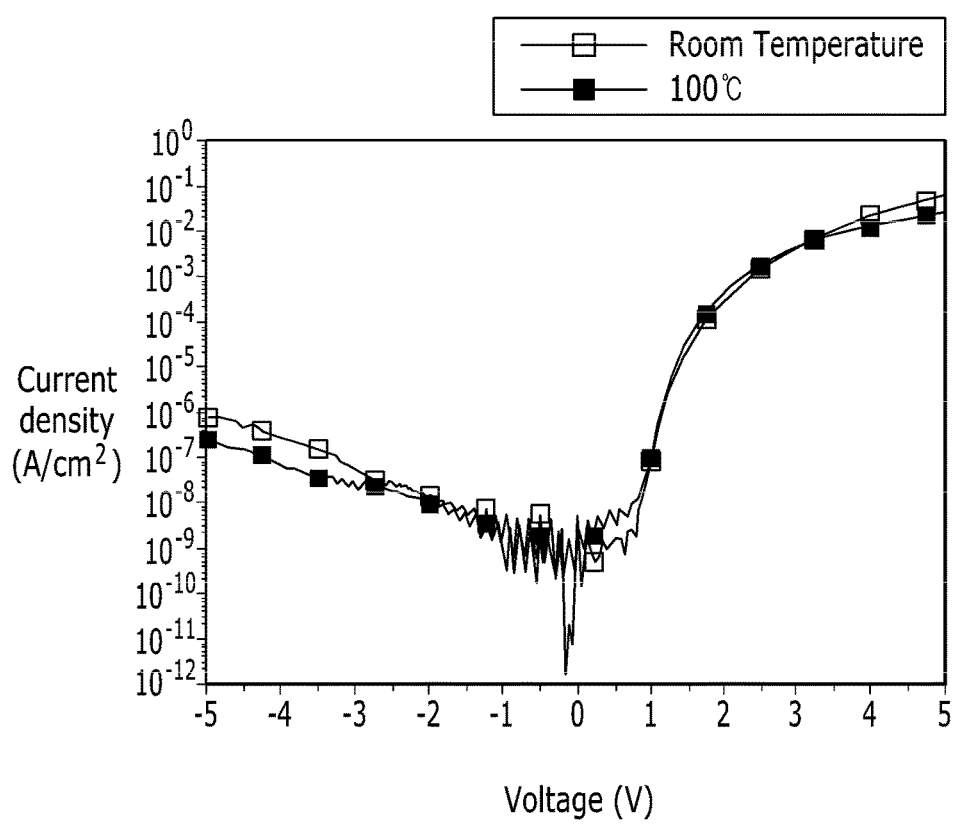
FIG. 13 is a graph showing current density change of the organic photoelectronic device according to Example 1 depending on a voltage before and after being allowed to stand at 100° C. for 30 minutes.

FIG. 10 is a graph showing external quantum efficiency (EQE) of the organic photoelectronic device of Example 1 depending on an applied voltage and a wavelength, FIG. 11 is a graph showing external quantum efficiency (EQE) of the organic photoelectronic device of Example 1 after allowing it to stand at 100° C. for 30 minutes depending on an applied voltage and a wavelength, FIG. 12 is a graph showing external quantum efficiency (EQE) change of the organic photoelectronic device of Example 1 before and after allowing it to stand at 100° C. for 30 minutes depending on a voltage, and FIG. 13 is a graph showing current density change of the organic photoelectronic device of Example 1 before and after allowing it to stand at 100° C. for 30 minutes depending on a voltage.

Referring to FIGS. 10 to 13, the organic photoelectronic device of Example 1 exhibits almost no external quantum efficiency (EQE) and current density change after being allowed to stand at 100° C. for 30 minutes. Accordingly, the organic photoelectronic device of Example 1 does not show a deteriorated performance and has a high thermal stability after being allowed to stand at high temperature.

While this disclosure has been described in connection with what is presently considered to be practical example embodiments, it is to be understood that the invention is not limited to the disclosed example embodiments, but, on the contrary, is intended to cover various modifications and equivalent arrangements included within the spirit and scope of the appended claims.

What is claimed is:

1. An organic photoelectronic device, comprising
a first electrode and a second electrode, and
an active layer between the first electrode and the second electrode,
wherein the active layer comprises a p-type semiconductor compound represented by Chemical Formula 1, and
an n-type semiconductor compound having a maximum absorption peak in a wavelength region of about 500 nm to about 600 nm and represented by Chemical Formula 2:

[Chemical Formula 1]

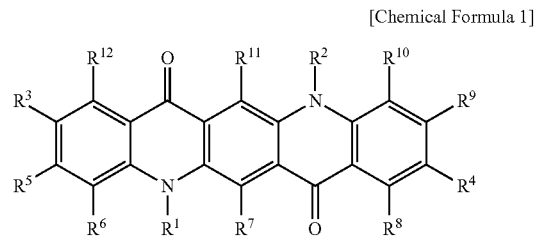

wherein
$R^1$ and $R^2$ are independently hydrogen, a substituted or unsubstituted C1 to C30 alkyl group, a substituted or unsubstituted C6 to C30 aryl group, a substituted or unsubstituted C3 to C30 heteroaryl group having electron donating characteristics, or a combination thereof, R³ and R⁴ are independently a substituted or unsubstituted C1 to C30 alkyl group, a substituted or unsubstituted C6 to C30 aryl group, a substituted or unsubstituted C3 to C30 heteroaryl group having electron donating characteristics, or a combination thereof, and R⁵ to R¹² are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C30 alkoxy group, a halogen atom, a halogen-containing group, or a combination thereof,

[Chemical Formula 2]

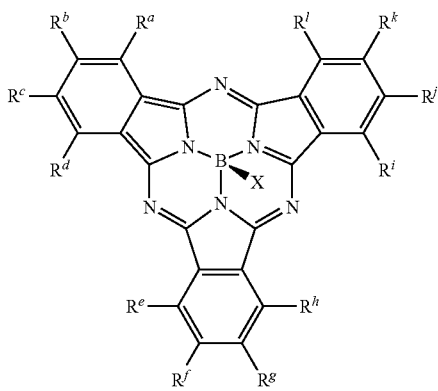

wherein

R$^a$ to R$^l$ are independently hydrogen, a substituted or unsubstituted C1 to C30alkyl group, a substituted or unsubstituted C6 to C30 aryl group, a substituted or unsubstituted C3 to C30 heteroaryl group, a halogen atom, a halogen-containing group, or a combination thereof, and X is an anion;

wherein the active layer comprises an intrinsic layer including the p-type semiconductor compound and the n-type semiconductor compound in a thickness ratio of about 1:10 to about 10:1.

2. The organic photoelectronic device of claim 1, wherein R³ and R⁴ are independently a linear C1 to C10 alkyl group.

3. The organic photoelectronic device of claim 2, wherein R¹ and R² are independently a linear C1 to C10 alkyl group.

4. The organic photoelectronic device of claim 1, wherein the compound represented by Chemical Formula 1 is a compound represented by Chemical Formula 1a:

[Chemical Formula 1a]

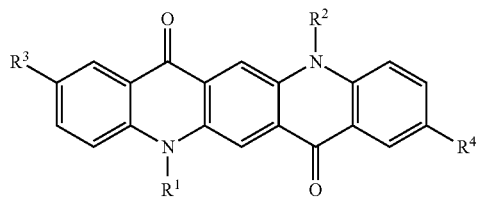

wherein, in Chemical Formula 1a,

R¹ to R⁴ are independently a substituted or unsubstituted C1 to C30 alkyl group, a substituted or unsubstituted C6 to C30 aryl group, a substituted or unsubstituted C3 to C30 heteroaryl group having electron donating characteristics, or a combination thereof.

5. The organic photoelectronic device of claim 4, wherein R¹ to R⁴ of Chemical Formula 1a are independently a linear C1 to C10 alkyl group.

6. The organic photoelectronic device of claim 4, wherein the compound represented by Chemical Formula 1a is represented by Chemical Formula 1aa or 1ab:

[Chemical Formula 1aa]

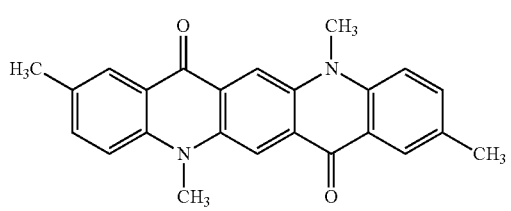

[Chemical Formula 1ab]

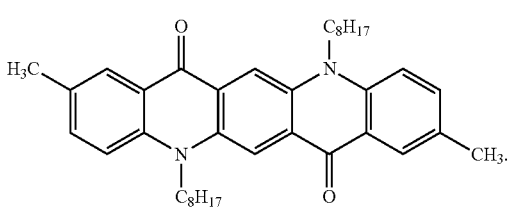

7. The organic photoelectronic device of claim 1, wherein the p-type semiconductor compound has a thermal decomposition temperature that is greater than or equal to about 300° C.

8. The organic photoelectronic device of claim 1, wherein the p-type semiconductor compound has an extinction coefficient that is greater than or equal to about 30,000 cm$^{-1}$ at a maximum absorption wavelength ($\lambda_{max}$).

9. The organic photoelectronic device of claim 1, wherein at least one of R$^a$ to R$^l$ comprises a halogen atom, and at least one of R$^m$ to R$^u$ comprises a halogen atom.

10. The organic photoelectronic device of claim 1, wherein the compound represented by Chemical Formula 2 comprises at least one of the compounds represented by Chemical Formulae 2a to 2e:

[Chemical Formula 2a]

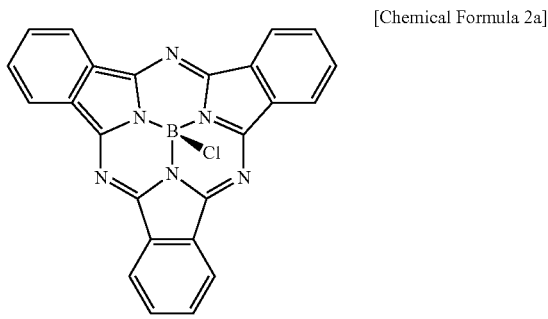

[Chemical Formula 2b]

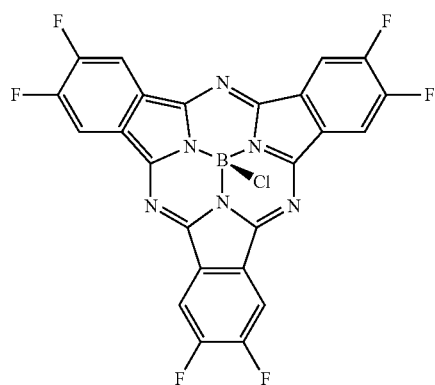

[Chemical Formula 2c]

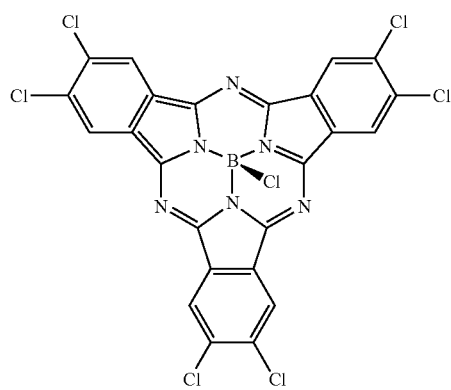

[Chemical Formula 2d]

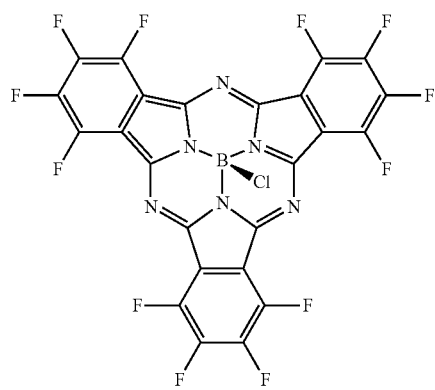

[Chemical Formula 2e]

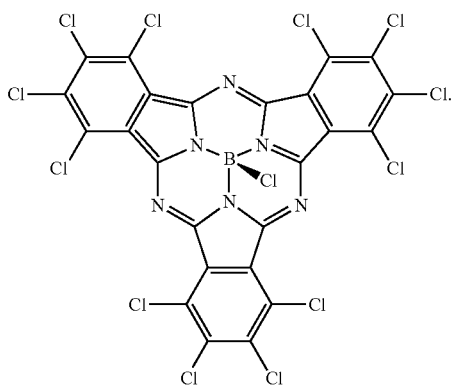

11. The organic photoelectronic device of claim 1, wherein the active layer comprises at least one of a p-type layer including the p-type semiconductor compound and an n-type layer including the n-type semiconductor compound.

12. The organic photoelectronic device of claim 1, wherein the active layer comprises a p-type layer including the p-type semiconductor compound and an n-type layer including the n-type semiconductor compound.

13. The organic photoelectronic device of claim 1, further comprising a charge auxiliary layer positioned at least one of between the first electrode and the active layer and between the second electrode and the active layer.

14. The organic photoelectronic device of claim 1, wherein the first electrode and the second electrode are transparent electrodes.

15. An image sensor including the organic photoelectronic device of claim 1.

16. The image sensor of claim 15, wherein the organic photoelectronic device is configured to selectively absorb light of a green wavelength region.

17. The image sensor of claim 16, wherein the image sensor comprises a red pixel, a green pixel, and a blue pixel,
the red pixel comprises a red filter and a red photo-sensing device,
the green pixel comprises a green photo-sensing device electrically connected to the organic photoelectronic device, and
the blue pixel comprises a blue filter and a blue photo-sensing device.

* * * * *